United States Patent [19]
Lur et al.

[11] Patent Number: 5,374,583
[45] Date of Patent: Dec. 20, 1994

[54] TECHNOLOGY FOR LOCAL OXIDATION OF SILICON

[75] Inventors: Water Lur, Taipei; Jiun Y. Wu, Dou-Lio; Anna Su, Hsin-Chu, all of Taiwan, Prov. of China

[73] Assignee: United Microelectronic Corporation, Hsinchu,

[21] Appl. No.: 249,308

[22] Filed: May 24, 1994

[51] Int. Cl.$^5$ .............................. H01L 21/76
[52] U.S. Cl. ....................... 437/67; 437/63; 437/64; 437/69; 437/72; 148/DIG. 50
[58] Field of Search ............. 437/69, 70, 72, 73, 437/67, 63, 64; 148/DIG. 50

[56] References Cited

U.S. PATENT DOCUMENTS

| | | | |
|---|---|---|---|
| 4,211,582 | 7/1980 | Horng et al. | 437/67 |
| 5,204,280 | 4/1993 | Dhong et al. | 437/52 |
| 5,292,689 | 3/1994 | Cronin et al. | 437/67 |
| 5,308,786 | 5/1994 | Lur et al. | 437/63 |

FOREIGN PATENT DOCUMENTS

| | | | |
|---|---|---|---|
| 0245538 | 11/1987 | European Pat. Off. | 437/67 |
| 0113343 | 9/1980 | Japan | 437/72 |
| 0094646 | 7/1981 | Japan | 437/72 |
| 0255040 | 11/1986 | Japan | 437/72 |

OTHER PUBLICATIONS

VLSI Technology, International Edition, by S. M. Sze, McGraw-Hill Book Co. New York, N.Y., ©1988 by McGraw-Hill Book Co. pp. 473–474.

*Primary Examiner*—Brian E. Hearn
*Assistant Examiner*—Trung Dang
*Attorney, Agent, or Firm*—George O. Saile

[57] ABSTRACT

A new method of local oxidation by means of forming a plurality of silicon trenches is described. Portions of the insulating layer over the surface of a silicon substrate not covered by a mask pattern are etched through exposing the portion of the silicon substrate that will form the device isolation region. A first trench is etched into the exposed portion of the substrate. A layer of silicon nitride is deposited over the insulating layer and within the trench. A layer of an aluminum-silicon alloy is deposited overlying the silicon nitride layer. The aluminum-silicon layer is etched away whereby silicon nodules are formed on the surface of the silicon nitride layer. The nodules are oxidized to form silicon dioxide nodules. Using the silicon dioxide nodules as a mask, the silicon nitride layer is etched through to the insulating layer where it exists and to the silicon substrate surface where it is exposed and a set of narrow trenches is etched into the exposed portions of the substrate. The silicon substrate within the set of trenches is oxidized wherein the silicon is transformed to silicon dioxide and the silicon dioxide expands to fill the set of trenches. The silicon nitride layer and the silicon dioxide nodules within the opening are pushed up to align with the silicon nitride layer and the silicon dioxide nodules on either side of the opening. The remaining insulating layer and silicon nitride layer are removed wherein the silicon dioxide nodules are also removed completing the device isolation of the IC.

18 Claims, 3 Drawing Sheets

TECHNOLOGY FOR LOCAL OXIDATION OF SILICON

BACKGROUND OF THE INVENTION

1. Field of the Invention

This invention relates to the fabrication of integrated circuit devices and more particularly to a method of local oxidation using local plurality silicon trenches before the growth of field oxide in the fabrication of integrated circuits.

2. Description of the Prior Art

Local oxidation of silicon is the conventional lateral isolation scheme. The conventional local oxidation process (LOCOS) is described in *VLSI Technology*, International Edition, by S. M. Sze, McGraw-Hill Book Company, New York, N.Y., c. 1988 by McGraw-Hill Book Co., pp. 473–474. Referring to FIG. 1, a layer of silicon nitride 3 is deposited over a pad oxide 2 overlying a silicon substrate 1. The pad oxide is a thin thermal oxide which allows better adhesion between the nitride and silicon and acts as a stress relaxation layer during field oxide formation. The nitride and oxide layers are etched to leave openings 4 exposing portions of the silicon substrate where the local oxidation will take place. A boron channel-stop layer 5 is ion implanted into the isolation regions. Referring now to FIG. 2, the field oxide 6 is grown within the openings and the nitride and pad oxide layers are removed. This completes the local oxidation.

There are many disadvantages to the conventional LOCOS method. Bird's beak encroachment 7 is caused by the lateral oxidation of silicon along the pad oxide under the nitride layer during the high temperature and long time required by the oxidation process. The white ribbon effect, in which there exists a narrow region of nonoxidized silicon, is caused by the diffusion of nitrogen-like material from the compressive-stressed nitride layer edge into the neighboring underlying tensile-stressed pad oxide layer. The oxide thickness tends to thin in narrow openings because of the difference of oxygenic gas flow into different LOCOS opening sizes and the variation of nitride edge-induced stress. The non-recessed surface and tremendous stress that exists around the active area are caused by the inherent volume expansion that is about 2.2 times for the reaction from silicon to silicon dioxide.

U.S. Pat. No. 5,204,280 to Dhong et al shows a method for forming multiple pillars inside a trench for use as part of a DRAM trench capacitor.

SUMMARY OF THE INVENTION

A principal object of the invention is to provide an effective and very manufacturable method to locally oxidize the silicon in an integrated circuit.

Another object of the present invention is to provide a method of local oxidation of silicon that will have small "bird's beak" and no white ribbon effect.

Yet another object is to provide a method of local oxidation which is free of oxide thinning in narrow openings.

Yet another object of the invention is to provide a method of locally oxidizing the silicon in an integrated circuit whereby a minimum of stress is generated.

Yet another object is to provide a method of local oxidation which has a fully recessed surface.

In accordance with the objects of this invention, a new method of local oxidation by means of forming a plurality of silicon trenches is achieved. An insulating layer is formed over the surface of a silicon substrate. Portions of the insulating layer not covered by a mask pattern are etched through to the silicon substrate so as to provide an opening exposing the portion of the silicon substrate that will form the said device isolation region. A first trench is etched into the exposed portion of the silicon substrate. A layer of silicon nitride is deposited over the insulating layer and within the first trench in the silicon substrate. A layer of an aluminum-silicon alloy is deposited overlying the silicon nitride layer. The aluminum-silicon layer is etched away whereby silicon nodules are formed on the surface of the silicon nitride layer. The silicon nodules are oxidized to form silicon dioxide nodules. The silicon nitride layer is etched through to the insulating layer where it exists and to the silicon substrate surface where the substrate is exposed within the opening using the silicon dioxide nodules as a mask. A set of narrow trenches is etched into the exposed portions of the silicon substrate within the opening using the silicon dioxide nodules as a mask. Channel-stops are selectively ion implanted through the opening into the substrate underneath the set of trenches. The silicon substrate within the set of trenches is oxidized wherein the silicon substrate is transformed to silicon dioxide and wherein the silicon dioxide expands to fill the set of trenches and whereby the silicon nitride layer and the silicon dioxide nodules within the opening are pushed up to align with the silicon nitride layer and the silicon dioxide nodules on either side of the opening. The remaining insulating layer and silicon nitride layer are removed wherein the silicon dioxide nodules are also removed completing the device isolation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
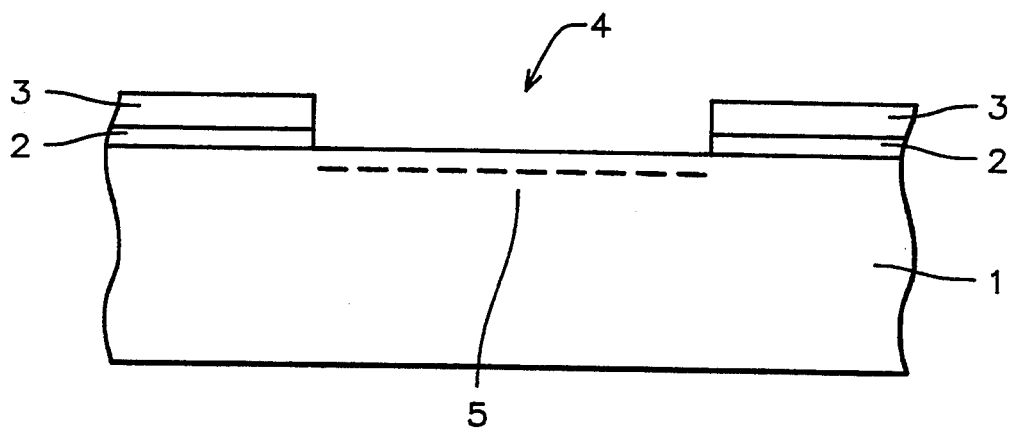
FIGS. 1 and 2 schematically illustrate in cross-sectional representation a LOCOS process of the prior art.
Figure 2:
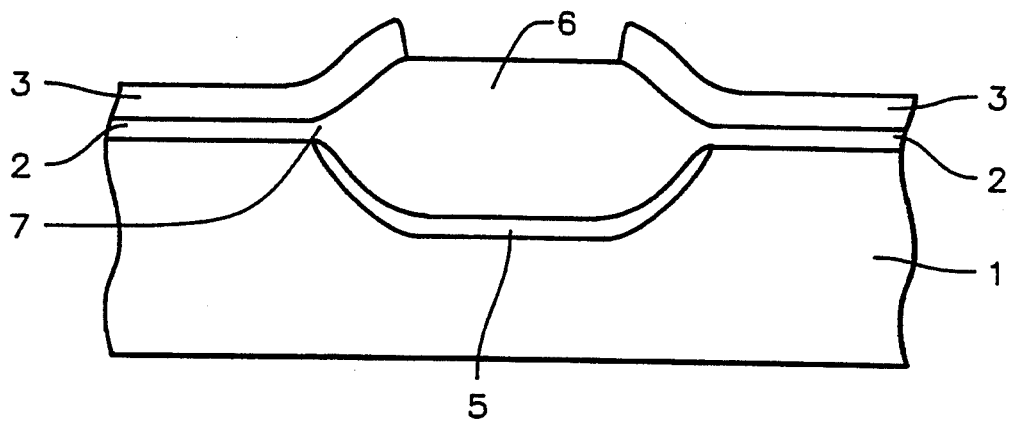
Figure 3:
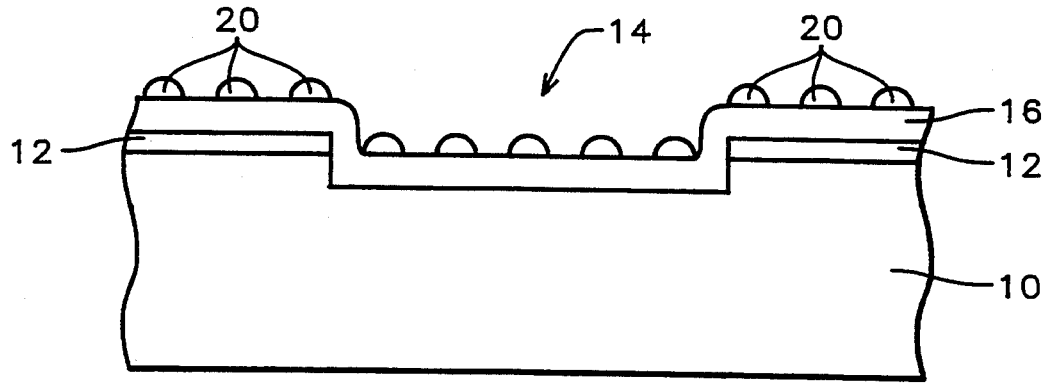
FIGS. 3 through 6 schematically illustrate in cross-sectional representation one preferred embodiment of the present invention.

Referring now more particularly to FIG. 3, the process of the invention will be described. There is shown a monocrystalline silicon substrate 10. A layer 12 of silicon dioxide is chemically vapor deposited (CVD) or thermally grown on the surface of the substrate to a preferred thickness of between about 500 to 1000 Angstroms. The silicon dioxide layer is patterned to leave openings 14 exposing portions of the silicon substrate where the local oxidation will take place.

The silicon substrate is etched using $Cl_2$, HBr, $O_2$, or the like where it is exposed within openings 14 to form a trench with a depth of between about 1000 to 2000 Angstroms. In order to obtain a stress-free field oxide growth, it is the ideal case that silicon be transformed to silicon dioxide and to expand isotropically in all directions by 1.3 times. If the final thickness of the field oxide is to be 5000 Angstroms, the pre-etch of silicon should be about 1200 Angstroms. A layer of silicon nitride 16 is deposited by CVD over the surface of the substrate and within the silicon trench.

A layer of aluminum-silicon alloy AL-Si(1-4%) is sputter deposited at a temperature of 400° C. or greater to a thickness of between about 5000 to 20,000 Angstroms over the surface of the silicon nitride layer 16. Alternatively, the aluminum-silicon alloy may deposited by sputtering at a low temperature and heated after deposition to greater than about 400° C. The metal alloy layer is reactive ion etched using $BCl_3$, $Cl_2$, or the like until all of the metal has been removed. The solubility of Si in Al is less than 0.1% at room temperature. The silicon content precipitates during the cooling stage after deposition at high temperatures. The silicon precipitates are found to distribute randomly at the aluminum grain boundaries and at the interface of the aluminum and the underlayer. It is well known that it is difficult to etch silicon during metal etching and silicon nodules 20 are always observed thereafter. An additional overetch step to get rid of these silicon nodules is necessary in metal etching. Since the solubility of aluminum in silicon is very tiny at room temperature, these silicon nodules are nearly pure silicon in composition.

The density of the precipitated silicon after metal alloy etch should be about 0.05 cubic micrometers per micrometer squared area and the precipitated silicon should have a hemispherical shape. The aluminum alloy Al-Si(1-4%) with a thickness of about 20,000 Angstroms and deposited or post-annealed at between about 400° to 500° C. will provide this result. The silicon nodules are oxidized at a temperature of between about 800° to 1100° C. in $H_2O$ or $O_2$ for a few seconds to a few minutes to form silicon dioxide nodules 20.

Figure 4:
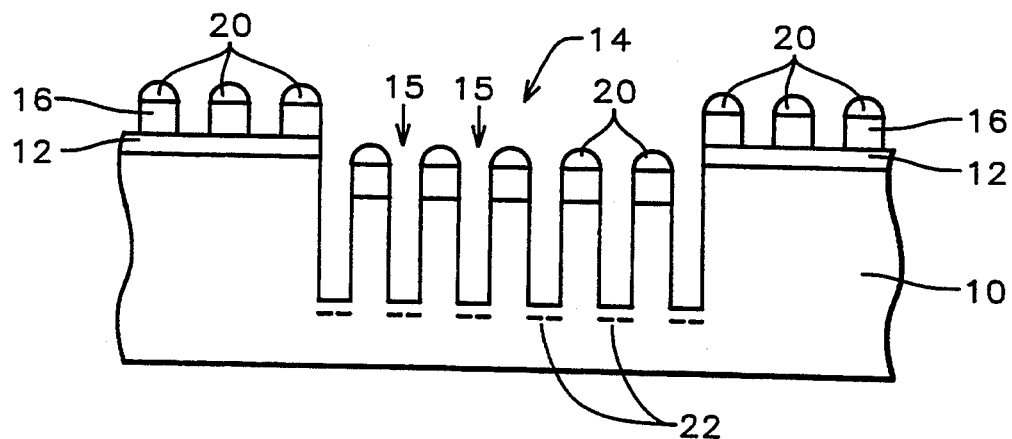

Referring now to FIG. 4, $SF_6$, He, or the like is used to etch through the silicon nitride layer 16 to the underlying silicon oxide layer 12 where it exists and to the silicon substrate 10 in those portions within openings 14. The silicon dioxide nodules 20 act as an etching mask. Next, the exposed silicon substrate 10 is etched using $Cl_2$, He, or the like to form narrow trenches 15 which are between about 3000 to 6000 Angstroms deep. The silicon dioxide nodules 20 act as a mask for this etch.

Channel-stops 22 are selectively ion implanted into the substrate through the narrow trenches 15. Boron ions are implanted with a dosage of between about 1 E 13 to 1 E 14 atoms/$cm^2$ and at an energy of between about 10 to 50 KeV. The channel-stop implants serve to prevent inversion of p-type silicon under the field oxide.

Figure 5:
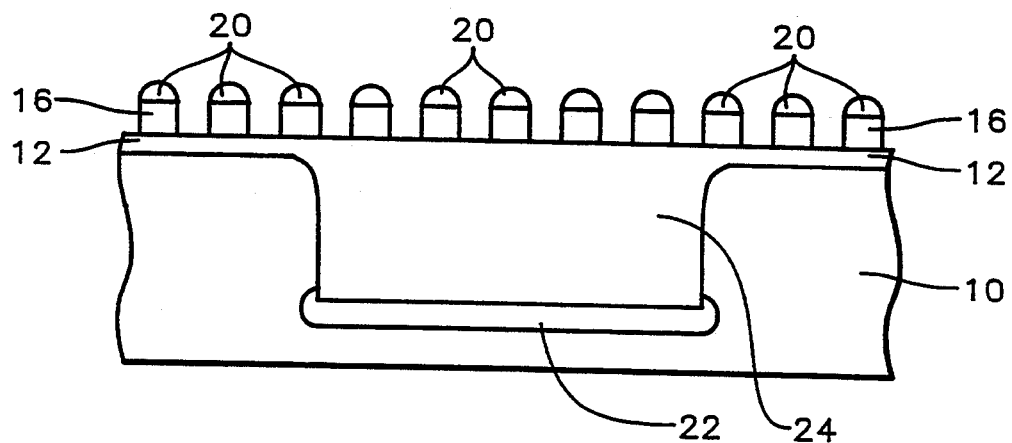

Referring now to FIG. 5, field oxidation is performed within the openings 14. As the field oxidation takes place, the pillars composed of silicon nitride and silicon dioxide nodules within the openings 14 are pushed up to align with the pillars on either side of the openings 14. The field oxidation is performed at a temperature of between about 800° to 1100° C. for between about 10 to 100 minutes in $O_2$ and/or $O_2+H_2$. Field oxide region 24 is formed.

Figure 6:
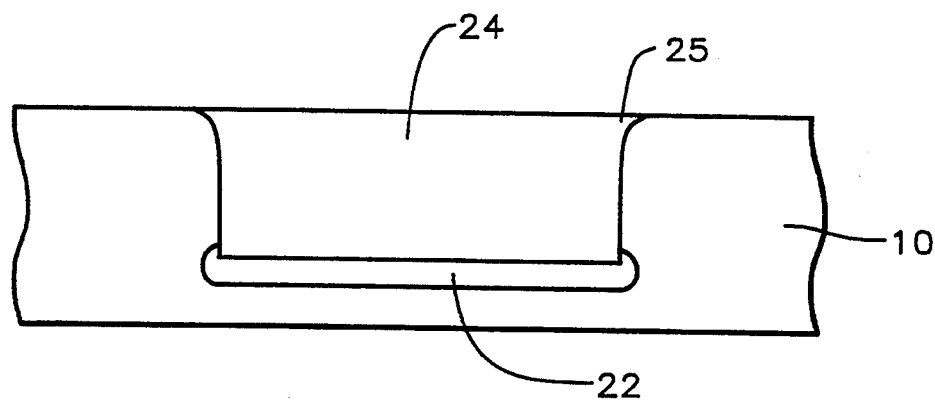

The silicon nitride layer 16 is stripped by dipping in hot $H_3PO_4$ solution. This also removes the silicon nodules 20. The thin silicon oxide layer 12 is removed by dipping in a diluted hydrofluoric acid solution, such as $HF:H_2O=1:10$ for about 1 to 5 minutes to leave the completed non-recessed field oxide region 24 shown in FIG. 6. The bird's beak 25 is very small.

This completes the local oxidation of the integrated circuit. Only a short oxidation time is required for the process of the invention resulting in a small bird's beak. The white ribbon effect is absent as most of the stress is released during the high temperature, short time oxidation. The oxide thickness thinning effect is also absent since the oxygenic gas is guided to flow into the plurality silicon trenches of similar size. The non-recessed surface and remaining stress is avoided since there is enough space for the silicon to be oxidized and to expand to silicon dioxide.

Figure 7:
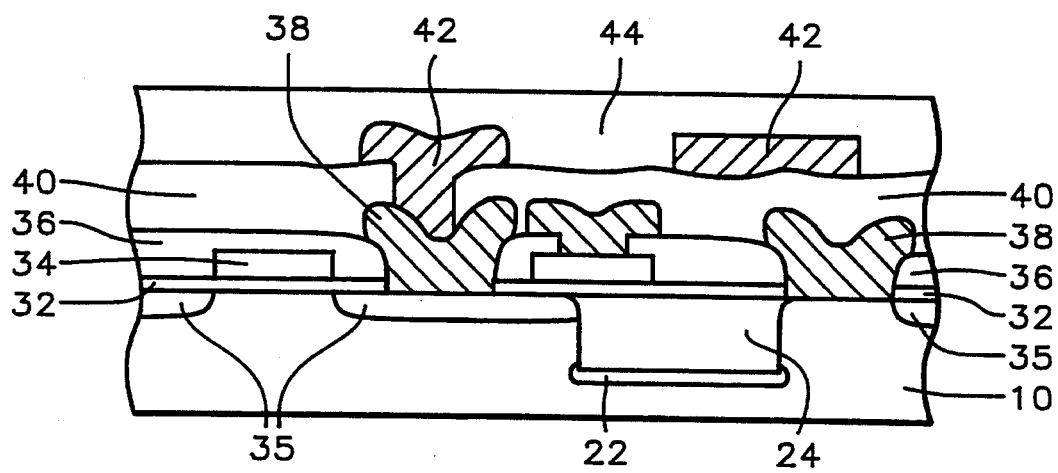
FIG. 7 schematically illustrates in cross-sectional representation a completed integrated circuit of the present invention.

The integrated circuit may be completed as is conventional in the art. For example, referring to FIG. 7, gate oxide layer 32 may be formed followed by patterning to provide openings for buried contact regions. A threshold-adjust ion implant may be required at this point or before the growth of the gate oxide layer 32. Next, gate electrode 34 and source/drain regions 35 are fabricated. Dielectric layer 36, which may be a phosphorus-doped chemical vapor deposited oxide or borophosphosilicate glass (BPSG) is deposited. Contact openings are etched through the dielectric layer to expose the source/drain regions where contacts are desired. Metal layer 38, typically aluminum, is deposited and patterned to complete contacts to the source/drain regions followed by the deposition of an intermetal dielectric layer 40. A second metallization 42 is deposited and patterned. A top capping layer 44 of silicon nitride and/or an oxide complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming a device isolation region of an integrated circuit by means of a plurality of silicon trenches comprising:

providing an insulating layer over the surface of a silicon substrate;

etching through portions of said insulating layer not covered by a mask pattern to said silicon substrate so as to provide an opening exposing the portion of said silicon substrate that will form the said device isolation region;

etching a first trench into said exposed portion of said silicon substrate;

depositing a layer of silicon nitride over said insulating layer and within said first trench in said silicon substrate;

depositing a layer of an aluminum-silicon alloy overlying said silicon nitride layer;

etching away said aluminum, silicon layer whereby silicon nodules are formed on the surface of said silicon nitride layer;

oxidizing said silicon nodules to form silicon dioxide nodules;

etching through said silicon nitride layer to said insulating layer where it exists and to said silicon substrate surface where said substrate is exposed within said opening using said silicon dioxide nodules as a mask;

etching a set of narrow trenches into said exposed portions of said silicon substrate within said opening using said silicon dioxide nodules as a mask;

selectively ion implanting channel-stops through said opening into said substrate underneath said set of trenches;

oxidizing said silicon substrate within said set of trenches wherein said silicon substrate is transformed to silicon dioxide and wherein said silicon dioxide expands to fill said set of trenches and whereby said silicon nitride layer and said silicon dioxide nodules within said opening are pushed up to align with said silicon nitride layer and said silicon dioxide nodules on either side of said opening; and removing remaining said insulating layer and said silicon nitride layer wherein said silicon dioxide nodules are also removed completing said device isolation of said integrated circuit.

2. The method of claim 1 wherein said first insulating layer is composed of silicon dioxide and has a preferred thickness of between about 500 to 1000 Angstroms.

3. The method of claim 1 wherein said first trench is etched to a depth of between about 1000 to 2000 Angstroms.

4. The method of claim 1 wherein said silicon nitride layer has a preferred thickness of between about 500 to 2000 Angstroms.

5. The method of claim 1 wherein said aluminum-silicon alloy layer is composed of between about 1 to 4% silicon and is deposited at greater than about 400° C. to a preferred thickness of between about 5000 to 20,000 Angstroms.

6. The method of claim 1 wherein said aluminum-silicon alloy layer is composed of between about 1–4% silicon and is deposited to a preferred thickness of between about 5000 to 20,000 Angstroms and is annealed after deposition at greater than about 400° C.

7. The method of claim 1 wherein said aluminum-silicon layer is reactive ion etched whereby all aluminum is removed and whereby said silicon nodules are formed on the surface of said silicon nitride layer.

8. The method of claim 1 wherein said set of narrow trenches is etched to a depth of between about 3000 to 6000 Angstroms.

9. The method of claim 1 wherein said channel-stop implantation uses boron ions with a dosage of between about 1 E 13 to 1 E 14 atoms/cm$^2$ and energy of between about 10 to 50 KeV.

10. The method of field oxidation of an integrated circuit wherein said field oxidation has a non-recessed surface and wherein said field oxidation has a small bird's beak comprising:

providing an insulating layer over the surface of a silicon substrate;

etching through portions of said insulating layer not covered by a mask pattern to said silicon substrate so as to provide an opening exposing the portion of said silicon substrate that will form the said field oxidation;

etching a first trench into said exposed portion of said silicon substrate;

depositing a layer of silicon nitride over said insulating layer and within said first trench in said silicon substrate;

depositing a layer of an aluminum-silicon alloy overlying said silicon nitride layer;

etching away said aluminum-silicon layer whereby silicon nodules are formed on the surface of said silicon nitride layer;

oxidizing said silicon nodules to form silicon dioxide nodules;

etching through said silicon nitride layer to said insulating layer where it exists and to said silicon substrate surface where said substrate is exposed within said opening using said silicon dioxide nodules as a mask;

etching a set of narrow trenches into said exposed portions of said silicon substrate within said opening using said silicon dioxide nodules as a mask;

selectively ion implanting channel-stops through said opening into said substrate underneath said set of trenches;

oxidizing said silicon substrate within said set of trenches wherein said silicon substrate is transformed to silicon dioxide and wherein said silicon dioxide expands to fill said set of trenches wherein said field oxidation is formed with a small said bird's beak and whereby said silicon nitride layer and said silicon dioxide nodules within said opening are pushed up to align with said silicon nitride layer and said silicon dioxide nodules on either side of said opening so that the surface of said field oxidation is non-recessed; and removing remaining said insulating layer and said silicon nitride layer wherein said silicon dioxide nodules are also removed completing said field oxidation of said integrated circuit.

11. The method of claim 10 wherein said insulating layer is composed of silicon dioxide and has a preferred thickness of between about 500 to 1000 Angstroms.

12. The method of claim 10 wherein said first trench is etched to a depth of between about 1000 to 2000 Angstroms.

13. The method of claim 10 wherein said silicon nitride layer has a preferred thickness of between about 500 to 2000 Angstroms.

14. The method of claim 10 wherein said aluminum-silicon alloy layer is composed of between about 1–4% silicon and is deposited at greater than about 400° C. to a preferred thickness of between about 5000 to 20,000 Angstroms.

15. The method of claim 10 wherein said aluminum-silicon alloy layer is composed of between about 1–4% silicon and is deposited to a preferred thickness of between about 5000 to 20,000 Angstroms and is annealed after deposition at greater than about 400° C.

16. The method of claim 10 wherein said aluminum-silicon layer is reactive ion etched whereby all aluminum is removed and whereby said silicon nodules are formed on the surface of said silicon nitride layer.

17. The method of claim 10 wherein said set of narrow trenches is etched to a depth of between about 3000 to 6000 Angstroms.

18. The method of claim 10 wherein said channel-stop implantation uses boron ions with a dosage of between about 1 E 13 to 1 E 14 atoms/cm$^2$ and energy of between about 10 to 50 KeV.

* * * * *